(12) United States Patent
Chung et al.

(10) Patent No.: US 8,405,133 B2
(45) Date of Patent: Mar. 26, 2013

(54) SEMICONDUCTOR DEVICE INCLUDING GRAPHENE AND METHOD OF MANUFACTURING THE SEMICONDUCTOR DEVICE

(75) Inventors: Hyun-jong Chung, Hwaseong-si (KR); Jae-ho Lee, Seoul (KR); Jae-hong Lee, Anyang-Si (KR); Hyung-cheol Shin, Seoul (KR); Sun-ae Seo, Hwaseong-si (KR); Sung-hoon Lee, Hwaseong-si (KR); Jin-seong Heo, Suwon-si (KR); Hee-jun Yang, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/286,592

(22) Filed: Nov. 1, 2011

(65) Prior Publication Data
US 2012/0112250 A1    May 10, 2012

(30) Foreign Application Priority Data
Nov. 5, 2010  (KR) .................. 10-2010-0109778

(51) Int. Cl.
*H01L 29/76*    (2006.01)

(52) U.S. Cl. ............... 257/288; 257/24; 257/59; 257/72; 257/213; 257/347; 438/149; 438/151; 438/195

(58) Field of Classification Search .................. None
See application file for complete search history.

(56) References Cited

U.S. PATENT DOCUMENTS
2010/0006823 A1    1/2010    Anderson et al.

FOREIGN PATENT DOCUMENTS

| JP | 2007067024 A  | 3/2007  |
| JP | 2008205272 A  | 9/2008  |
| JP | 2009-164432 A | 7/2009  |
| JP | 2009-182173 A | 8/2009  |
| JP | 2009-277803 A | 11/2009 |

*Primary Examiner* — Chuong A Luu
*Assistant Examiner* — Shantanu C Pathak
(74) *Attorney, Agent, or Firm* — Harness, Dickey & Pierce, P.L.C.

(57) ABSTRACT

In a semiconductor device including graphene, a gate insulating layer may be formed between a gate electrode and a graphene layer, and an interlayer insulating layer may be formed under a portion of the graphene layer under which the gate insulating layer is not formed. The gate insulating layer may include a material that has higher dielectric permittivity than the interlayer insulating layer.

8 Claims, 5 Drawing Sheets

SEMICONDUCTOR DEVICE INCLUDING GRAPHENE AND METHOD OF MANUFACTURING THE SEMICONDUCTOR DEVICE

CROSS-REFERENCE TO RELATED APPLICATIONS

This application claims the benefit of Korean Patent Application No. 10-2010-0109778, filed on Nov. 5, 2010, in the Korean Intellectual Property Office, the disclosure of which is incorporated herein in its entirety by reference.

BACKGROUND

1. Field

Example embodiments relate to semiconductor devices including graphene and methods of manufacturing the semiconductor devices.

2. Description of the Related Art

Graphene refers to a material that has a 2-dimensional hexagonal carbon structure. Graphene has desirable electrical and thermal characteristics. Due to such properties, research into graphene is being actively performed.

Graphene is a zero gap semiconductor, and thus, the carrier mobility of graphene at room temperature is about 100 times greater than that of conventional silicon: $100,000\ cm^2V^{-1}s^{-1}$. Due to a higher carrier mobility, graphene may be used in high-speed driving devices, for example, radio frequency (RF) devices.

When a graphene nano-ribbon (GNR) is formed by limiting a channel width of graphene, a band gap may be formed due to a size effect. A field effect transistor that is drivable at room temperature may be manufactured using GNR. When a field effect transistor is manufactured based on a conventional global back gate structure, a parasitic component, e.g., a parasitic capacitance, may be increased due to passage of a gate over a source and a drain, and thus, the characteristics of the field effect transistor may deteriorate.

SUMMARY

Example embodiments provide semiconductor devices that include graphene and have a structure that reduces a parasitic component. Example embodiments also provide methods of manufacturing the above semiconductor devices. Additional aspects will be set forth in part in the description which follows and, in part, will be apparent from the description, or may be learned by practice of example embodiments.

According to example embodiments, a semiconductor device may include a gate electrode on a substrate, a gate insulating layer on the gate electrode, an interlayer dielectric layer between the substrate and the gate electrode, and on side portions of the gate electrode and the gate insulating layer, the interlayer dielectric layer including a material that has a lower dielectric permittivity than the gate insulating layer; a graphene layer on the gate insulating layer and the interlayer dielectric layer, and a source and a drain on the graphene layer.

The gate electrode may have at least one gate finger protruding from the gate electrode. The at least one gate finger may be formed under a portion of the graphene layer between the source and the drain. The at least one gate finger may be two or more gate fingers. The source and the drain may be alternately formed between the two or more gate fingers on the graphene layer. A portion of the graphene layer between the source and the drain may be a channel region. The semiconductor device may be a radio frequency (RF) device.

According to example embodiments, a method of manufacturing a semiconductor device including graphene may include forming a dielectric layer by doping a substrate with a first insulating material, forming a gate electrode and a gate insulating layer on the dielectric layer, forming an interlayer dielectric layer and exposing the gate insulating layer by doping the gate electrode and the gate insulating layer with a second insulating material, forming a graphene layer on the interlayer dielectric layer and the gate insulating layer, and forming a source and a drain on the graphene layer.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
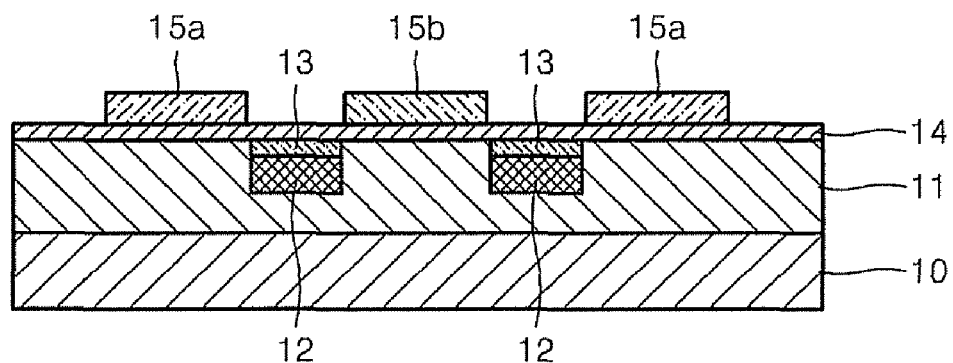
FIG. 1 is a cross-sectional view of a semiconductor device including graphene according to example embodiments.

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects of the present description.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
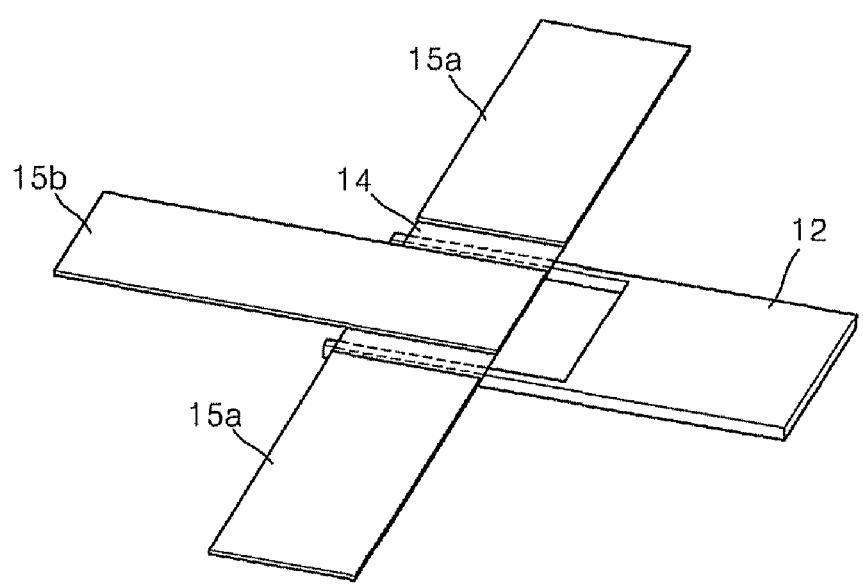
FIG. 2 is a schematic perspective view of a semiconductor device including graphene according to example embodiments.

FIG. 1 is a cross-sectional view of a semiconductor device including graphene according to example embodiments. FIG. 2 is a schematic perspective view of a semiconductor device including graphene according to example embodiments.

Referring to FIG. 1, an interlayer dielectric (ILD) layer 11 may be formed on a substrate 10, and may surround bottom and side portions of two gate electrodes 12. A gate insulating layer 13 may be formed on the gate electrode 12, and a side portion of the gate insulating layer 13 may be surrounded by the interlayer dielectric layer 11. A graphene layer 14 may be formed on the interlayer dielectric layer 11 and the gate insulating layer 13. A source 15a and a drain 15b may be formed on the graphene layer 14, and a portion of the graphene layer 14 between the source 15a and the drain 15b may be a channel region.

As described above, in the semiconductor device according to example embodiments, the channel region may be formed by the graphene layer 14, and the gate insulating layer 13, which is formed of a high-k material, may be formed under the channel region. The interlayer dielectric layer 11 may be formed on a lower surface of a portion of the graphene layer 14 other than the channel region.

Referring to FIG. 2, the gate electrodes 12 illustrated in FIG. 1 constitute one structure and each have a protruded shape. The gate electrodes 12 are also referred to as gate fingers. The semiconductor device of FIG. 1 includes the two gate electrodes 12, the drain 15b may be formed between the gate electrodes 12 and the source 15a may be formed outside each of the gate electrodes 12. The source 15a and the drain 15b may be alternately formed between the gate electrodes 12, and the gate electrodes 12, the source 15a, and the drain 15b do not overlap each other. Thus, when the semiconductor device of FIG. 1 is driven, a parasitic component may be minimized or reduced.

Materials that constitute the respective layers of the semiconductor device of FIGS. 1 and 2 will now be described in detail. The substrate 10 may include silicon or other materials. The interlayer dielectric layer 11 may include, for example, a silicon oxide or other insulating materials. For example, the interlayer dielectric layer 11 may include an oxide having silicon and other materials. For example, the interlayer dielectric layer 11 may include an oxide of a material that is not silicon.

The gate electrode 12 may include a metal, a conductive metal oxide, or metal nitride, and a material for forming the gate electrode 12 may be any one of various materials that are used to form a gate electrode in a conventional semiconductor device. The gate electrode 12 may include a single- or multi-layer formed of a conductive material.

The gate insulating layer 13 may include an insulating material which is different from a material used to form the interlayer dielectric layer 11. The gate insulating layer 13 may include a material that has higher dielectric permittivity than that of a material used to form the interlayer dielectric layer 11. For example, if the interlayer dielectric layer 11 includes silicon oxide, the gate insulating layer 13 may include a high-k material having higher dielectric permittivity. If the gate insulating layer 13 includes a material having higher dielectric permittivity, a driving voltage of the semiconductor device may be reduced. If the interlayer dielectric layer 11 includes a material having lower dielectric permittivity than that of the material used to form the gate insulating layer 13, a parasitic capacitance between the gate electrode 12 and at least one selected from the source 15a and the drain 15b may be lowered.

Each of the source 15a and the drain 15b may be formed of a metal, a conductive metal oxide, or metal nitride, and any material that is used to form a source or drain in a conventional semiconductor device may be used to form the source 15a and the drain 15b. The source 15a or the drain 15b may be a mono- or multi-layer formed of a conductive material.

A semiconductor device including graphene according to example embodiments may be used in a high-speed driving device, for example, a radio frequency (RF) device. In general, in an RF circuit, device characteristic deterioration may occur due to a parasitic component between an inverter or resistance and a gate electrode. However, if as described in example embodiments, the gate electrode 12 is disposed under the channel region, the occurrence of a parasitic component may be prevented or reduced. Characteristics of an RF device may be evaluated based on a cutoff frequency and a maximum oscillation frequency. The cutoff frequency and maximum oscillation frequency may be increased when a gate parasitic capacitance is reduced. In example embodiments, a semiconductor device having desirable characteristics may be obtained.

Figure 3A:
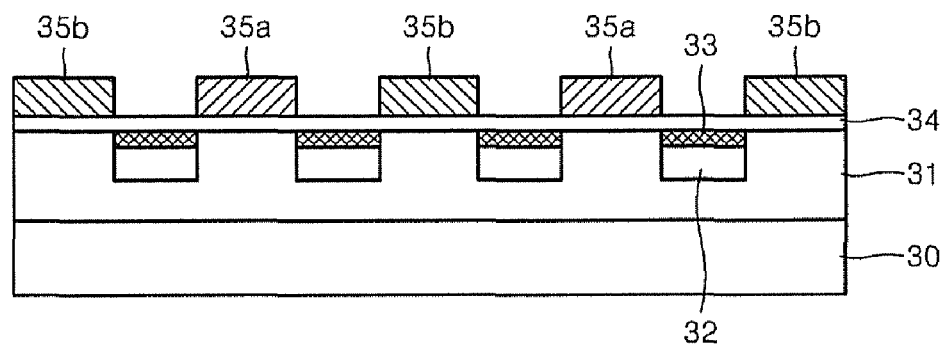
FIG. 3A is a cross-sectional view of a semiconductor device including graphene and a plurality of gate fingers according to example embodiments.
Figure 3B:
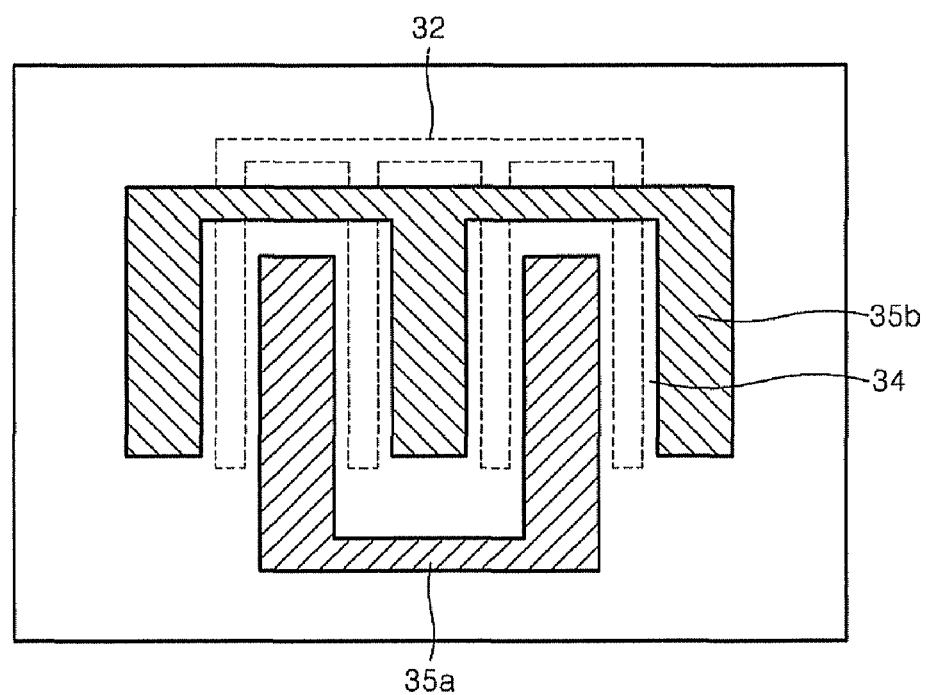
FIG. 3B is a plan view of the semiconductor device of FIG. 3A.

FIGS. 3A and 3B are respectively cross-sectional and schematic plan views of an example of a semiconductor device including a gate electrode 32 having a plurality of protrusions or gate fingers. Referring to FIG. 3A, the gate electrode 32 and a gate insulating layer 33 may be formed on a substrate 30, and an interlayer dielectric layer 31 may be formed between the substrate 30 and the gate electrode 32. The interlayer dielectric layer 31 may surround bottom and side portions of the gate electrode 32. A graphene layer 34 may be formed on the gate insulating layer 33 and the interlayer dielectric layer 31, and a source 35a and a drain 35b may be alternately formed on the graphene layer 34.

Referring to FIG. 3B, the gate electrode 32 illustrated in FIG. 3A has a plurality of gate protrusions, and the source 35a or the drain 35b may be formed between the protrusions. The graphene layer 34 may be formed as a channel region between the gate fingers and the source 35a and the drain 35b.

In the semiconductor device illustrated in FIGS. 3A and 3B, the gate electrode 32 has a plurality of protrusions. If the semiconductor device is used as a RF device, the plurality of protrusions may lower a gate resistance.

Figure 4A:
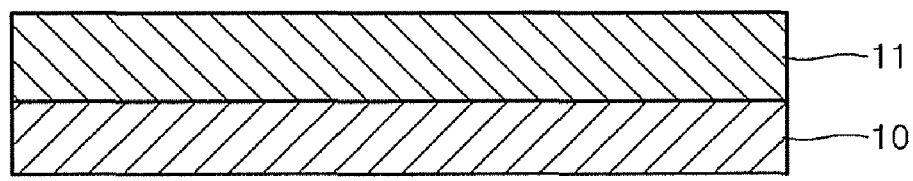
FIGS. 4A to 4E are sectional views for illustrating a method of manufacturing a semiconductor device including graphene according to example embodiments.

FIGS. 4A to 4E are sectional views for illustrating a method of manufacturing a semiconductor device including graphene, according to example embodiments. Referring to FIG. 4A, a substrate 10 is prepared, and the substrate 10 may be coated with an insulating material to form an interlayer dielectric layer 11. The insulating material may be deposited in consideration of a height where a gate electrode is to be formed.

Figure 4B:
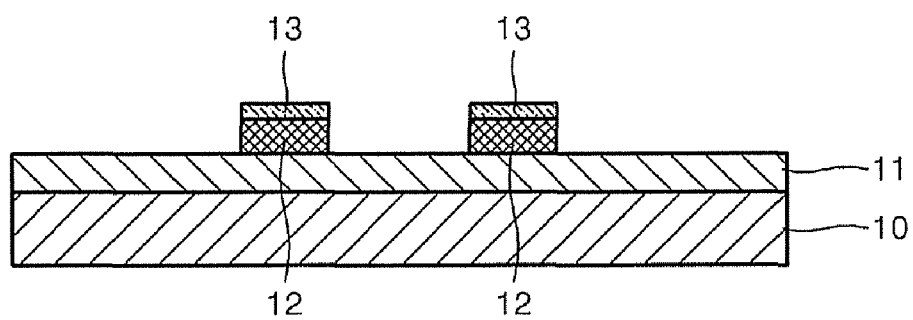

Referring to FIG. 4B, a gate electrode 12 and a gate insulating layer 13 may be formed on the interlayer dielectric layer 11. For example, the interlayer dielectric layer 11 may be doped with a metal, a conductive metal oxide or a metal nitride, and doped with a material for forming the gate insulating layer 13 thereon. The gate electrode 12 and the gate insulating layer 13 may be patterned. The material for forming the gate insulating layer 13 may have higher dielectric permittivity than that of the material for forming the interlayer dielectric layer 11.

Figure 4C:
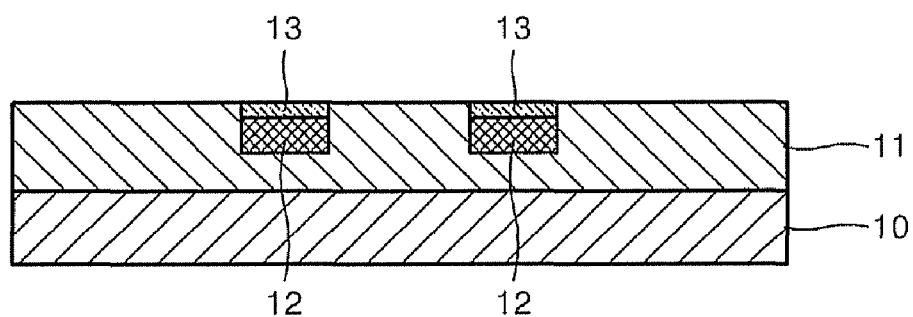

Referring to FIG. 4C, the resultant structure may further be doped with the material for forming the interlayer dielectric layer 11 while surrounding the gate electrode 12 and the gate insulating layer 13. An etching process may be performed thereon until the gate insulating layer 13 is exposed. For example, an etch-back process or a chemical mechanical polishing process may be used. The interlayer dielectric layer 11 may be formed by plasma enhanced CVD (PECVD), or other deposition methods.

Figure 4D:
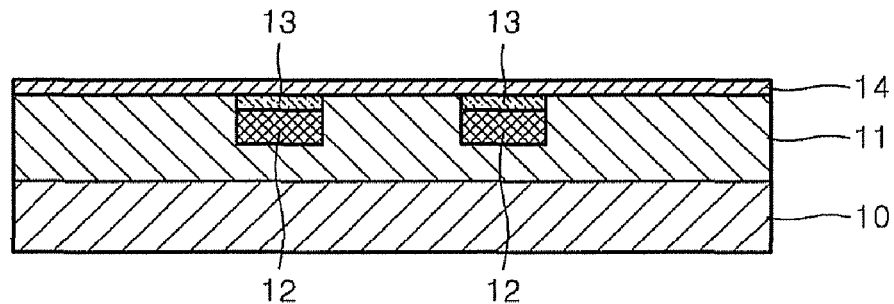

Referring to FIG. 4D, a graphene layer 14 may be formed on the interlayer dielectric layer 11 and the gate insulating layer 13. The graphene layer 14 may be formed by transferring a separate graphene on the interlayer dielectric layer 11 and the gate insulating layer 13. Alternatively, the graphene layer 14 may be formed by growing graphene directly on the interlayer dielectric layer 11 and the gate insulating layer 13. In this regard, the transferred graphene may be a CVD graphene or a flake sample. The graphene layer 14 may have a single- or multi-layer structure.

Figure 4E:
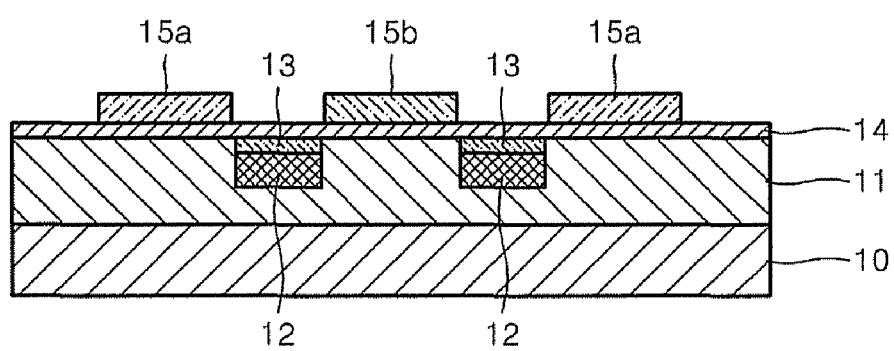

Referring to FIG. 4E, a source 15a and a drain 15b may be formed on the graphene layer 14. A metal, a conductive metal oxide or a metal nitride may be deposited on the graphene layer 14, and the resultant structure may be patterned.

Figure 5:
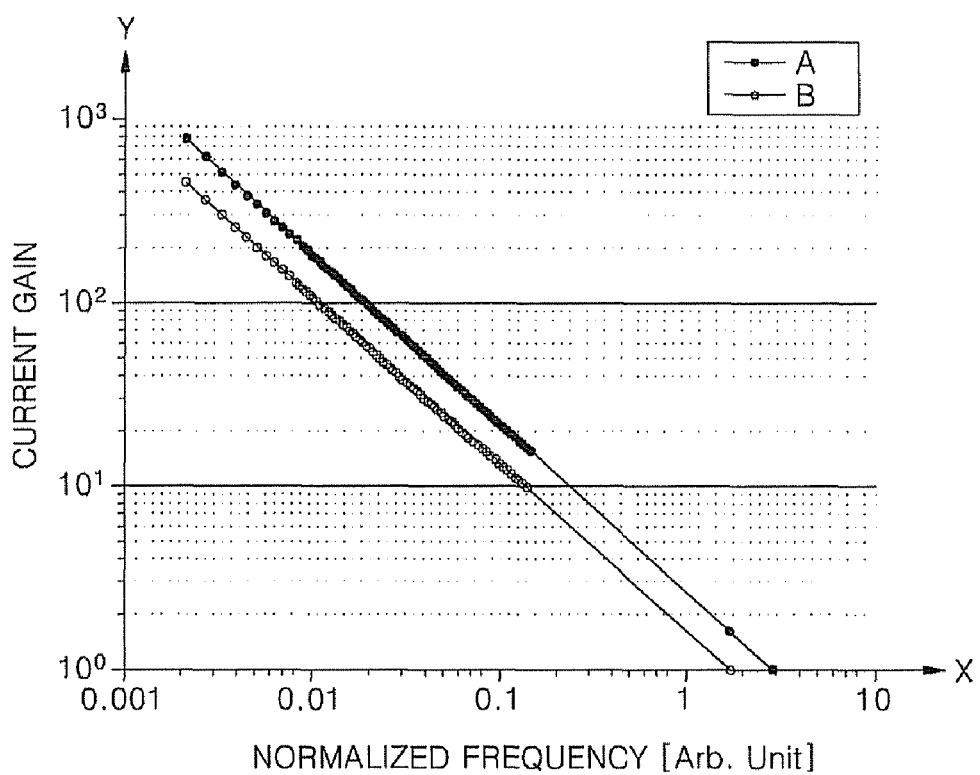
FIG. 5 is a simulation graph of current gains of a semiconductor device including graphene according to example embodiments and an RF device in which a gate insulating layer is formed under a graphene layer.

FIG. 5 is a simulation graph of current gains of a semiconductor device including graphene according to example embodiments and an RF device in which a gate insulating layer is formed under a graphene layer. Referring to FIG. 5, plot A relates to a semiconductor device according to example embodiments in which a gate insulating layer is formed under a channel region of a graphene layer and an interlayer dielectric layer made of $SiO_2$ is formed under a portion of the graphene layer other than the channel region, and plot B relates to an RF device in which a gate insulating layer is formed between an interlayer dielectric layer and a graphene layer, and between a gate electrode and the graphene layer.

Referring to FIG. 5, the performance of the RF device of plot A is about 1.6 times higher than that of the RF device of plot B. That is, when a gate insulating layer having higher dielectric permittivity is formed only between a gate electrode and a portion of the graphene layer corresponding to a channel region between a source and a drain, an RF having such a structure may have desirable characteristics.

Example embodiments provide a semiconductor device including graphene, whose parasitic component is reduced due to a back gate structure and non-overlapping between a gate and a source and a drain. Also, because an interlayer dielectric (ILD) layer and a gate insulating layer include different materials, a semiconductor device having such a structure may be used as a high-speed driving device.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. A semiconductor device comprising:
a gate electrode on a substrate;
a gate insulating layer on the gate electrode;
an interlayer dielectric layer between the substrate and the gate electrode, and on side portions of the gate electrode and the gate insulating layer, the interlayer dielectric layer including a material that has a lower dielectric permittivity than the gate insulating layer;
a graphene layer on the gate insulating layer and the interlayer dielectric layer; and
a source and a drain on the graphene layer.

2. The semiconductor device of claim 1, wherein the gate electrode has at least one gate finger protruding from the gate electrode.

3. The semiconductor device of claim 2, wherein the at least one gate finger is under a portion of the graphene layer between the source and the drain.

4. The semiconductor device of claim 2, wherein the at least one gate finger is two or more gate fingers.

5. The semiconductor device of claim 4, wherein the source and the drain are alternately formed between the two or more gate fingers on the graphene layer.

6. The semiconductor device of claim 1, wherein a portion of the graphene layer between the source and the drain is a channel region.

7. The semiconductor device of claim 1, wherein the semiconductor device is a radio frequency (RF) device.

8. A method of manufacturing a semiconductor device including graphene, the method comprising: forming a dielectric layer by doping a substrate with a first insulating material; forming a gate electrode and a gate insulating layer on the dielectric layer; forming an interlayer dielectric layer and exposing the gate insulating layer by doping the gate electrode and the gate insulating layer with a second insulating material; forming a graphene layer on the interlayer dielectric layer and the gate insulating layer; and forming a source and a drain on the graphene layer, wherein the gate insulating layer comprises a material that has a higher dielectric permittivity than the interlayer dielectric layer.

* * * * *